April 21, 1970 B. J. STERN 3,508,083

SOLID STATE TIME DELAY CIRCUIT FOR VOLTAGE LEVEL INPUT CHANGES

Filed May 17, 1967

*INVENTOR.*
BARRY J. STERN

United States Patent Office 3,508,083

Patented Apr. 21, 1970

3,508,083

SOLID STATE TIME DELAY CIRCUIT FOR VOLTAGE LEVEL INPUT CHANGES

Barry J. Stern, Hammond, Ind. (% Indiana Instruments, Inc., P.O. Box 8368, St. Petersburg, Fla. 33738)

Filed May 17, 1967, Ser. No. 639,151
Int. Cl. H03k 17/28, 3/10, 3/12
U.S. Cl. 307—293 1 Claim

ABSTRACT OF THE DISCLOSURE

The present invention relates to a novel solid state time delay circuit for voltage level input changes which illustrates the art of changing the state of a bistable multivibrator on the high to low voltage change of the output of a timing monostable multivibrator by means of a set trigger monostable multivibrator interconnected with the bistable multivibrator. The circuit comprises seven interchangeable transistors, seven interchangeable collector load resistors, nine interchangeable base resistors, two interchangeable trigger capacitors, and one timing capacitor. Voltage switching at high speeds is attainable.

Figure 1:
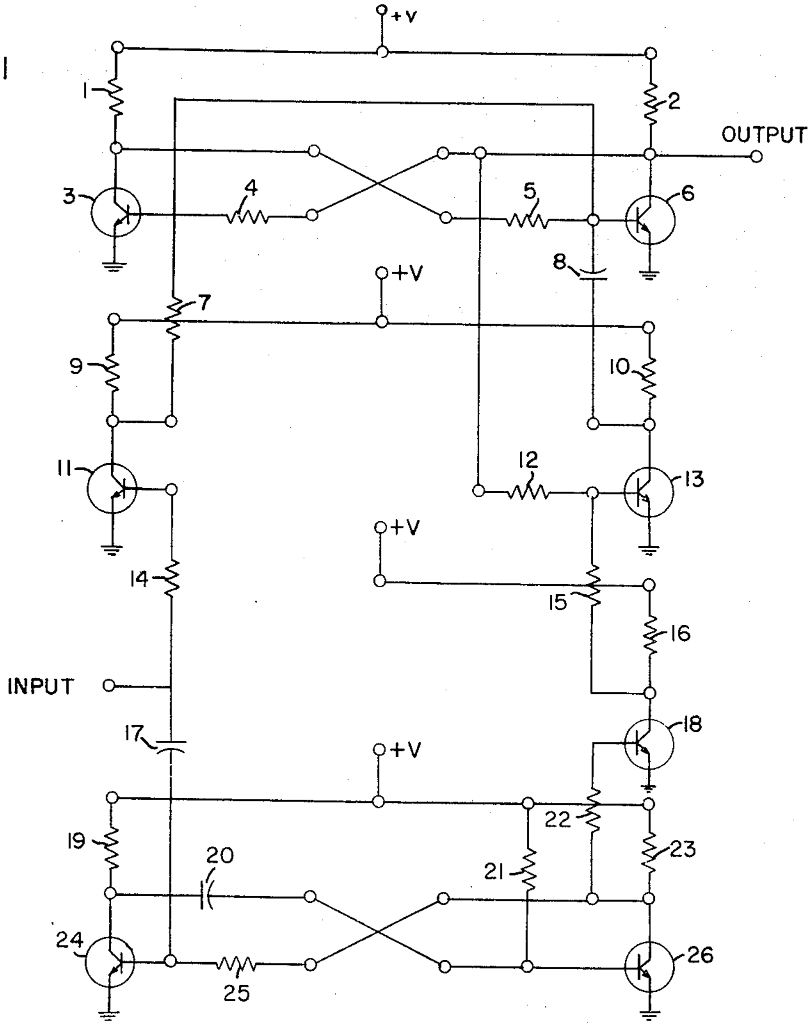
Figure 2:
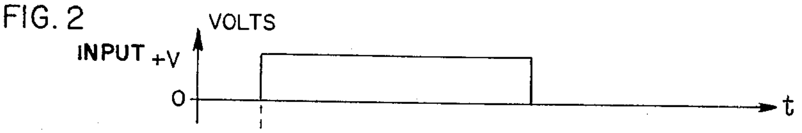
Figure 3:
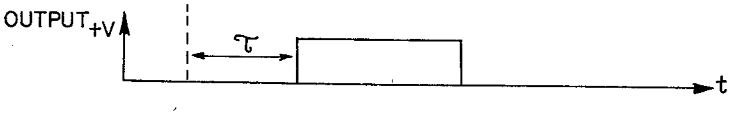

The present invention relates to a novel solid state time delay circuit for voltage level input changes.

It is an object of the present invention to provide a novel solid state time delay circuit for voltage level input changes which illustrates the art of interconnecting a trigger monostable multivibrator and a bistable multivibrator, as disclosed in patent application No. 576,317.

It is an object of the present invention to provide a novel solid state time delay circuit for voltage level input changes which illustrates the art of changing the state of a bistable multivibrator on the falling edge of the output of a timing monostable multivibrator.

It is an object of the present invention to provide a novel solid state time delay circuit for voltage level input changes which comprises seven interchangeable transistors, seven interchangeable collector load resistors, nine interchangeable base resistors, two interchangeable trigger capacitors, and one timing capacitor.

The invention, both as to means and methods employed therein, will better be understood by reference to the following specification and the drawings forming a part thereof, wherein:

FIGURE I illustrates a circuit schematic of the novel time delay circuit for voltage level input changes.

FIGURES II and III are illustrations of input and output waveforms of the solid state time delay circuit for voltage level input changes.

FIG. II illustrates an input pulse waveform of +V height and a duration which must be greater than the time delay $\tau$.

FIG. III illustrates the output pulse waveform for the input pulse waveform of FIG. II. The leading edge of the output pulse waveform is delayed a time $\tau$ from the leading edge of the input pulse waveform and the trailing edge of the input pulse waveform ends at the trailing edge of the input pulse waveform.

The operation of the time delay circuit may be followed by considering the input voltage to be zero. Transistors 6, 13 and 26 are on. Transistors 3, 11, 18 and 24 are off. A subsequent change of the input voltage to +V turns on transistor 11 and is coupled through differentiating capacitor 17 to the base of transistor 24 turning it on. This brings the positive end of capacitor 20 to ground turning transistor 26 off. Transistor 18 is turned on through resistor 22. Transistor 13 is turned off through resistor 15. Capacitor 8 charges to +V. After the time $t$, determined in seconds by .7 times the product of resistor

21 in ohms and capacitor 20 in farads, in which capacitor 20 charges to 0 volts, transistor 26 comes back on. Transistor 18 turns off through resistor 22. Transistor 13 turns on through resistor 15, grounding capacitor 8 which supplies a negative voltage at the base of transistor 6 turning it off. Transistor 3 turns on through resistor 4, holding transistor 6 off through resistor 5, resulting in a +V level output voltage. A subsequent change of the input voltage to zero volts turns transistor 11 off. Transistor 6 turns on through resistor 7. Transistor 3 turns off through resistor 4 and holds transistor 6 on through resistor 5 resulting in a zero level output voltage. Transistor 13 turns off through resistor 13. All transistors have returned to their initial state.

The minimum delay time and the time before another time delay may be initiated depends on the tie constants presented by energy storage eleents, capacitors 8, 17 and 20 and transistor junction capacitances, and the apparent external impedance at the terminals of these energy storage elements. The larger the values of capacitors 8, 17 and 20 the longer these times. These times may be measured experimentally or calculated from idealized models.

The values of the interchangeable base resistors and their respective input voltages must be adjusted with respect to the interchangeable collector load resistors and the transistor parameters so that the output voltage of one stage as an input to the next stage produces the same output voltage. One way of realizing this condition is to adjust the above values so that the transistors are saturated. For high speed operation this condition may be realized without saturation by a back clamping diode connected from the base to collector of each transistor.

It is contemplated that numerous variations and modifications within the purview of these skilled in the art can be made in the solid state time delay circuit for voltage level input changes, and it is intended to cover in the appended claim all such variations and modifications as fall within the true spirit and scope of the invention.

What is claimed is:

1. A solid state time delay circuit for voltage level input changes, said circuit comprising seven interchangeable transistors, seven interchangeable load resistors, nine interchangeable base resistors, two interchangeable coupling capacitors, one timing capacitor, one input terminal, one output terminal, one power terminal, and one ground terminal;

the emitter of each of said transistors connected to said ground terminal;

one of said load resistors connected between the collector of each of said transistors and said power terminal;

a bistable multivibrator formed from the first and second of said transistors, the collector of said first transistor connected to said output terminal, one of said base resistors connected between the base of said first transistor and the collector of said second transistor, one of said base resistors connected between the base of said second transistor and the collector of said first transistor;

a trigger monostable multivibrator formed from the first and third of said transistors, one of said coupling capacitors connected from the base of said first transistor to the collector of said third transistor, one of said base resistors connected between the base of said third transistor and the collector of said first transistor;

a timing monostable multivibrator formed from the fourth and fifth of said transistors, one of said coupling capacitors connected between the base of said fourth transistor and said input terminal, one of said base resistors connected between the base of said fourth transistor and the collector of said fifth transistor, said timing capacitor connected between the base of said fifth transistor and the collector of said fourth transistor, one of said base resistors connected between the base of said fifth transistor and said power supply terminal, the RC time constant of said timing capacitor and said base resistor adjusted to be less than the time duration of the input pulse waveform;

a coupling circuit between said timing monostable multivibrator and said trigger monstable multivibrator formed from the sixth of said transistors, one of said base resistors connected between the base of said sixth transistor and the collector of said fifth transistor, one of said base resistors connected between the base of said third transistor and the collector of said sixth transistor;

a coupling circuit between said input terminal and said bistable multivibrator formed from the seventh of said transistors, one of said base resistors connected between the base of said seventh transistor and said input terminal, one of aid base resistors connected between the base of said first transistor and the collector of said seventh transistor.

References Cited

UNITED STATES PATENTS

| | | | |
|---|---|---|---|
| 2,979,627 | 4/1961 | Halpern | 307—266 X |
| 3,017,524 | 1/1962 | Koletsky et al. | 307—291 X |
| 3,073,972 | 1/1963 | Jenkins | 307—266 X |
| 3,226,577 | 12/1965 | Azuma et al. | 307—273 X |
| 3,244,907 | 5/1966 | Daigle | 307—293 X |
| 3,365,586 | 1/1968 | Billings | 307—266 X |

JOHN S. HEYMAN, Primary Examiner

U.S. Cl. X.R.

307—266, 273, 291